(12) United States Patent
Signorelli et al.

(10) Patent No.: US 8,842,402 B2
(45) Date of Patent: Sep. 23, 2014

(54) LOW ON-RESISTANCE MOSFET IMPLEMENTED DC SOURCE BY-PASS OR CIRCUIT BREAKER WITH RELATED SELF-SUPPLIED CONTROLLER CIRCUIT INCLUDING FIRE OR OTHER RISK DC OUTPUT DISABLING MEANS

(75) Inventors: Tiziana Teresa Signorelli, Aci Bonaccorsi (IT); Francesco Pulvirenti, Acireale (IT); Natale Aiello, Trecastagni (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 738 days.

(21) Appl. No.: 13/106,346

(22) Filed: May 12, 2011

(65) Prior Publication Data

US 2011/0279937 A1    Nov. 17, 2011

(30) Foreign Application Priority Data

May 14, 2010   (IT) .............. VA2010A0043

(51) Int. Cl.
| | |
|---|---|
| H02H 3/20 | (2006.01) |
| H05H 13/00 | (2006.01) |
| H03K 17/30 | (2006.01) |
| H02J 7/35 | (2006.01) |
| H03K 17/06 | (2006.01) |
| H01L 31/02 | (2006.01) |

(52) U.S. Cl.
CPC ............. *H02J 7/35* (2013.01); *H03K 17/302* (2013.01); *H03K 17/063* (2013.01); *H03K 2217/0081* (2013.01); *Y02E 10/50* (2013.01); *H01L 31/02021* (2013.01)
USPC .............................. 361/86; 307/61

(58) Field of Classification Search
CPC ............ H03F 1/52; H02H 3/087; H02H 3/38; H02H 3/40; H03K 17/0826
USPC ......................... 361/79, 86; 307/61
See application file for complete search history.

(56) References Cited

U.S. PATENT DOCUMENTS

| | | | | |
|---|---|---|---|---|
| 6,093,885 | A * | 7/2000 | Takehara et al. ............... | 136/244 |
| 2008/0198523 | A1* | 8/2008 | Schmidt et al. .................. | 361/88 |
| 2009/0184746 | A1 | 7/2009 | Fahrenbruch ................. | 327/427 |

FOREIGN PATENT DOCUMENTS

| | | |
|---|---|---|
| DE | 102005018173 | 10/2006 |
| EP | 2141746 A2 | 1/2010 |
| IT | VA2010A000025 | 3/2010 |

* cited by examiner

*Primary Examiner* — Jared Fureman
*Assistant Examiner* — Nicholas Ieva
(74) *Attorney, Agent, or Firm* — Allen, Dyer, Doppelt, Milbrath & Gilchrist, P.A.

(57) ABSTRACT

A control circuit for a protection circuit device includes first and second voltage boosters, a comparator coupled thereto, and a MOSFET for bypassing a direct current (DC) source. The control circuit may include a control logic circuit having a first input coupled to an output of the comparator, a second input receiving a disable command signal, a first output coupled to an enable input of the first voltage booster, and a second output, and a four terminal path inversion switch. The control circuit may include a supply voltage line, a sensor coupled to the second input of the control logic circuit, to generate the disable command signal, and to force the MOSFET into a conduction mode, and an external command terminal coupled to the second input of the control logic circuit, to receive the disable command signal, and to force the MOSFET into the conduction mode.

24 Claims, 6 Drawing Sheets

LOW ON-RESISTANCE MOSFET IMPLEMENTED DC SOURCE BY-PASS OR CIRCUIT BREAKER WITH RELATED SELF-SUPPLIED CONTROLLER CIRCUIT INCLUDING FIRE OR OTHER RISK DC OUTPUT DISABLING MEANS

FIELD OF THE INVENTION

The present disclosure relates to a self-powered integrated circuit (IC) controlling a low conduction resistance metal-oxide-semiconductor field-effect transistor (MOSFET) to efficiently function as a by-pass diode or as a safety reverse polarity circuit breaker in a photovoltaic conversion system or similar multiple direct current (DC) sources power distribution network and battery powered systems.

BACKGROUND OF THE INVENTION

An Italian patent application, assigned to the present application's assignee, discloses a MOSFET implemented current by-pass device useful in photovoltaic panel conversion plants or similar DC power distribution networks and a polarity inversion safety device in battery powered systems that can be fabricated in a compact highly reliable system-in-package form. The device is based on the use of a high multiplication factor (HMF) inductive voltage booster. The voltage booster boosts a voltage from about 50-100 mV up to several Volts, the voltage being applied to the gate of a low on-resistance power MOSFET that is connected in parallel to a DC source or string of DC sources to be eventually by-passed. The applied voltage is for turning the MOSFET ON and maintaining it in conduction, assisted by a start-up low multiplication factor (LMF) charge pump made with low threshold transistors, and for providing a supply voltage to a polarity inversion detecting comparator of the drain-to-source voltage difference of the MOSFET.

In the event of a fire, it may be a safety risk to have photovoltaic DC power generating modules connected in series since they build up a significant DC voltage, the voltage being coupled to the input of a DC-AC inverter and converted to standard grid frequency and voltage. The modules may present an electrocution risk for fire-fighting operators, notwithstanding that an "anti-islanding" safety system may have disconnected the photovoltaic conversion plant from the grid and disabled the main DC-AC inverter of the generating plant.

Italian patent application No. VA2010A000025, of Mar. 15, 2010, discloses an approach to such a safety problem based on the deployment in each panel of a transceiver for receiving a disabling command from a remote location and a circuit for disabling a DC-DC converter with MPPT control installed in each panel.

SUMMARY OF THE INVENTION

An efficient and reliable way of disabling a single DC source or string of DC sources (e.g. a string of photovoltaic conversion cells, a photovoltaic conversion panel, or other DC source of a DC power collection/distribution network) in case of abnormally high temperature or of other sensed or recognized risk conditions is disclosed herein.

This disabling function is implemented with relatively minor additions to a basic self powered circuit of a MOSFET implemented current by-pass device useful in photovoltaic panel conversion plants or similar DC power collection/distribution networks, and to a polarity inversion safety device in battery powered systems, for example, to the integrated control circuit of the system-in-package device described in the above cited prior Italian patent application No. VA2010A000025, the contents of which are hereby incorporated by reference in their entirety.

Generally, a current by-pass or safety polarity inversion circuit breaker device, far more efficient than a traditional Schottky diode and thus ideally suited in photovoltaic panel conversion plants and in other applications where energy losses should be carefully minimized, may comprise a power switching MOSFET, the current terminals of which are connected to a DC power source connected in series to other DC power sources and/or to an electrical load as part of a DC power collection/distribution network, and an isolated gate terminal controlled by an in-package integrated control circuit. The integrated circuit may include a start-up low multiplication factor voltage booster of a negative drain/source voltage difference on the current terminals of the MOSFET caused by a current interruption within the DC power source supplying a reverse polarity comparator that enables a high multiplication factor voltage booster of the same negative drain/source voltage difference on the current terminals of the MOSFET. The output boosted voltage may be applied to the gate of the MOSFET for keeping it in conduction for as long as a negative drain/source voltage difference is sensed by the comparator, while the start-up low multiplication factor voltage booster ceases to work as soon as the negative drain/source voltage difference falls to the voltage drop over the $R_{DS}$ of the conductive MOSFET. The supply voltage to the comparator and to the high multiplication factor voltage booster may be derived through a diode from the output voltage of the booster itself.

According to another aspect, a MOSFET implemented current by-pass or safety polarity inversion circuit breaker device may include a function of safely disabling in an overruling fashion the DC power source to which the device is connected in parallel, in the event a risk condition is detected by an on-chip sensor or by an external command.

The function may be implemented by adding to the integrated control circuit of the state of the power switching MOSFET the following functional elements: a control logic circuit having a first input connected to the output of the reverse polarity comparator and at least a second input receiving an overruling disabling command signal; a first output connected to an enabling input of the high multiplication factor voltage booster and a second output; a four terminal path inversion switch of the drain/source voltage difference on the current terminals of the power MOSFET for inverting the power supply signs to the high multiplication factor voltage booster, controlled by the second output of the control logic circuit; an ancillary self-powering line sustaining adequate supply voltage of correct sign to the electronic circuitry when the drain-to-source voltage difference on the current terminals of the power switching MOSFET to be forced ON by the HMF booster is not inverted; and a risk condition sensor and/or an additional pin, eventually ORed to the second input, receiving an overruling disabling command signal from an external (remote) sensor or other agent.

The high multiplication factor voltage booster may be an inductive booster employing an in-package discrete inductor or a multistage charge pump employing in-package discrete capacitors or even a fully integrated multistage charge pump.

DETAILED DESCRIPTION OF THE PREFERRED EMBODIMENTS

Figure 1:
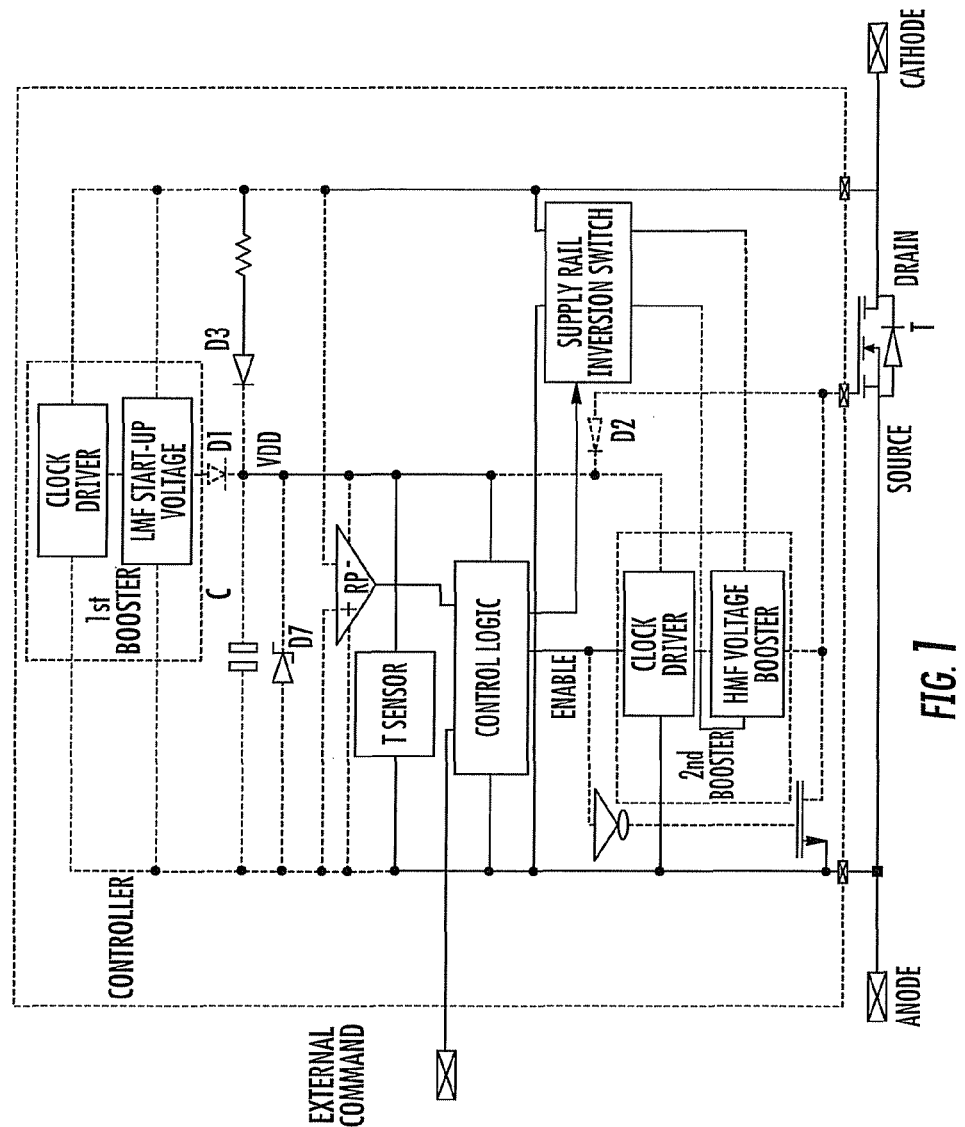
FIG. 1 is a functional block diagram of the enhanced by-pass diode system, according to the present invention.

An exemplary embodiment of the enhanced by-pass diode system-in-package device of this disclosure is depicted in form of basic functional block diagram in FIG. 1. The added circuit features that implement the useful function of auto-disabling of DC voltage generating sources in case of fire or other disruptive event to prevent risk of electrocution to operators intervening on site are distinctively traced with dashed lines. In the shown embodiment, the power switching component T is in the form of a discrete N-channel MOSFET power transistor, the current terminals of which are connected, respectively, to anode and cathode leads of external connection of the system-in-package by-pass device.

The state of the switching device T is controlled by an integrated control circuit contained inside the broken line perimeter with connection pads to the source, drain, and gate of the in-package discrete N-channel MOSFET. A start-up voltage booster (1$^{st}$ BOOSTER) comprises a common drive clock phases generating circuit and driver stage of a low multiplication factor charge pump circuit. The voltage booster eventually is supplied by a negative drain/source voltage difference on the current terminals of the power MOSFET T that may be caused by a current interruption occurring within the series connected DC source or multi-source string in parallel to the MOSFET (practically on the ANODE and CATHODE leads of the device, while other series connected DC source or multi-source string continue to generate DC current).

The start up voltage booster (1$^{st}$ BOOSTER) has the function of initially providing a sufficiently high supply voltage to the polarity inversion detecting comparator RP that senses the sign of the voltage difference present on the current terminals of the power switch T and therefore it may be required to raise the voltage difference from about 300-500 mV to just about 2 V in order to activate the polarity inversion detecting comparator RP. The number of stages and the capacitance values which may be required for implementing the LMF charge pump circuit are such to be implemented in integrated form on the semiconductor chip. Diode D1 protects the integrated charge pump circuit from overvoltages, while the tank capacitor C and the Zener diode DZ provide for a sufficiently stable supply voltage VDD.

The output state of the polarity inversion detector comparator RP controls the enabling and disabling of a high multiplication factor inductive HMF voltage booster (2$^{nd}$ BOOSTER), the output of which is directly connected to the control gate of the power switch T.

The main HMF voltage booster comprises a common clock signal generating oscillator and driver stage of either an inductive booster, using an in-package discrete inductor L connected to dedicated pads of the integrated control circuit, or alternatively of a multistage charge pump circuit. Through a line including a protection diode D2, the boosted voltage produced at the output of the second HMF voltage booster provides a stabilized VDD voltage for sustaining the self-supply of the clock generating and driver circuitry, RP comparator and of the added control logic and supply rail inversion switch circuitry, even when the so boosted voltage applied to the gate of the MOSFET force ON the power transistor to provide for a low voltage drop alternative path of by-pass to the generated electric current.

Preferably, the HMF voltage booster (2$^{nd}$ BOOSTER) is a multi-stage charge pump having a circuit architecture that permits a particularly effective realization of the whole charge pump circuit in integrated form, notwithstanding the fact that the main voltage booster may provide for a rather high multiplication factor adapted to boost the gate voltage to a value sufficiently high to turn on the MOSFET (upon detecting for example a by-pass requiring condition) and, most significantly, adapted to maintain ON the MOSFET notwithstanding the fact that upon entering a conduction state, the negative drain/source voltage difference at its current terminals rapidly drops down to become equivalent to the voltage drop over the $R_{DS}$ of the conducting MOSFET, which for reasons of efficiency, is as low as feasible and, according to state-of-the-art fabrication technologies, may be just 50-100 mV.

In practice, the multiplication factor of the second booster may reach magnitudes of about 50× to about 100×, such to be able to maintain the gate of the power MOSFET T at an overdrive voltage of about 5V. As observed in the basic circuit diagram of FIG. 1, the second or main voltage booster, once enabled by the polarity inversion detecting comparator RP, sustains the powering of the associated clock generating and drive circuitry, as well as the polarity inversion detecting comparator RP through a supply line, including the protection diode D2, notwithstanding the fact that the integrated start up LMF charge pump (1$^{st}$ BOOSTER) ceases to function as soon as the power MOSFET T turns ON because of the insufficiency of the low residual negative drain/source voltage difference to supply its functional circuits.

Figure 2:
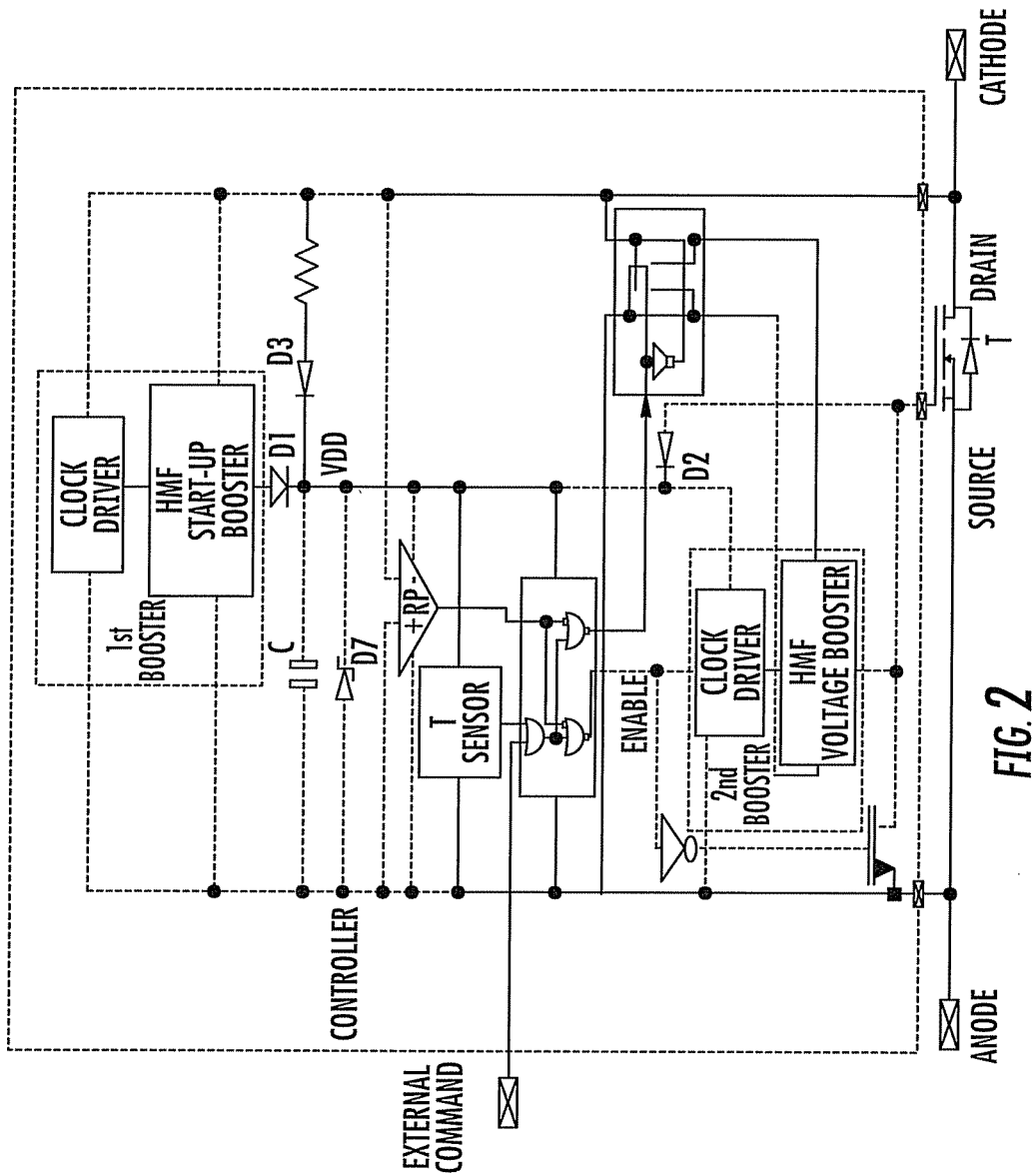
FIG. 2 is a detailed circuit diagram of the control logic block and of the supply rail inversion switch block of FIG. 1.

In the exemplary embodiment shown in FIG. 1 and shown in more detail in FIG. 2, the integrated controller chip, the boundary of which is indicated by the perimeter traced with a broken line, comprises a temperature sensor adapted to change its output logic state if a set maximum limit temperature is exceeded. The integrated temperature device (T_SENSOR) may have anyone of the typical circuit topologies, and the triggering limit temperature may be set to correspond to a suspiciously high temperature as could be produced by a nearby fire. The integrated controller has an additional pin, EXTERNAL COMMAND, dedicated to receive an external control signal from any source of overruling disabling command signal whether generated by an external sensor or coming from a remote control station. The logic output of the integrated temperature sensor and the external command pin are connected to respective inputs of an input NOR gate of the control logic circuit, an embodiment of which is detailed in FIG. 2.

The first input of the control logic block receives the output of the reverse polarity comparator RP, which is applied to the inverting input of the NAND gate and to an input of the NOR gate. The second input of this same NOR gate is coupled to the output of the input NOR gate, which is also applied to a second output NAND gate of the control logic. The output NOR gate of the control logic is connected to the enable/disable input of the HMF voltage booster while the output NAND gate is connected to a control input of the four terminal path inversion switch of the drain/source voltage difference present on the current terminals of the power MOSFET T.

As may be verified, the control logic enables the main HMF booster whenever the power switching transistor T should be forced ON by boosting the gate/source voltage difference, that is when either of the following conditions occurs: by-pass condition of operation abnormal "sub-generation" or "interruption" condition of the related string of photovoltaic modules or other DC source, at which the drain-to-source voltage difference of the power switching transistor T becomes reversed; and fire detection/suppression, that is when the sensed temperature exceeds a certain maximum threshold value or a suppression command is received through the dedicated pin for disabling the production of a voltage on the terminals of the panel in order to place in a safe state the plant to avoid electrocution risks to persons intervening in the site.

While in the event of a low-voltage drop bypass condition, the power supply to the circuitry is sustained by the main HMF voltage booster through the self-supply line provided with the protection diode D2, notwithstanding the turning off of the start-up LMF voltage booster. In the event of a fire detection/suppression condition, the drain-to-source voltage on the current terminals of the power switching transistor T are not reversed and therefore the main HMF voltage booster may work with a positive drain-to-source voltage difference as input and the triggered inversion of the sign of the input supply rail realized by the inversion switch satisfies this need. In this case and in consideration of the switching off of the start-up LMF voltage booster, sustaining adequate power supply of correct sign to the electronic circuitry of the integrated controller is provided directly from the drain-to-source voltage difference present on the current terminals of the power switching transistor T, through an ancillary self-supply line including a protection diode D3, connected to the supply node VDD of the integrated circuitry.

The supply rail inversion switch, an embodiment of which is detailed in FIG. 2, reverses the sign of the input drain-to-source voltage difference fed to the HMF only upon detecting the inversion of sign of the drain-to-source voltage difference by the RP comparator that would occur only in case of a by-pass condition detection. According to an embodiment of the multifunction current by-pass and polarity inversion circuit breaker device of this disclosure, the main HMF voltage booster, instead of being realized with the use of in-package discrete reactive components, for example with an in-package inductor of few μH, is realized in an integrated form on the controller chip by a multistage charge pump circuit having an architecture found to achieve an outstandingly favorable compromise between the requisites of reducing significantly the integration area requirement of the numerous circuit components and of energy conversion efficiency.

Figure 3:
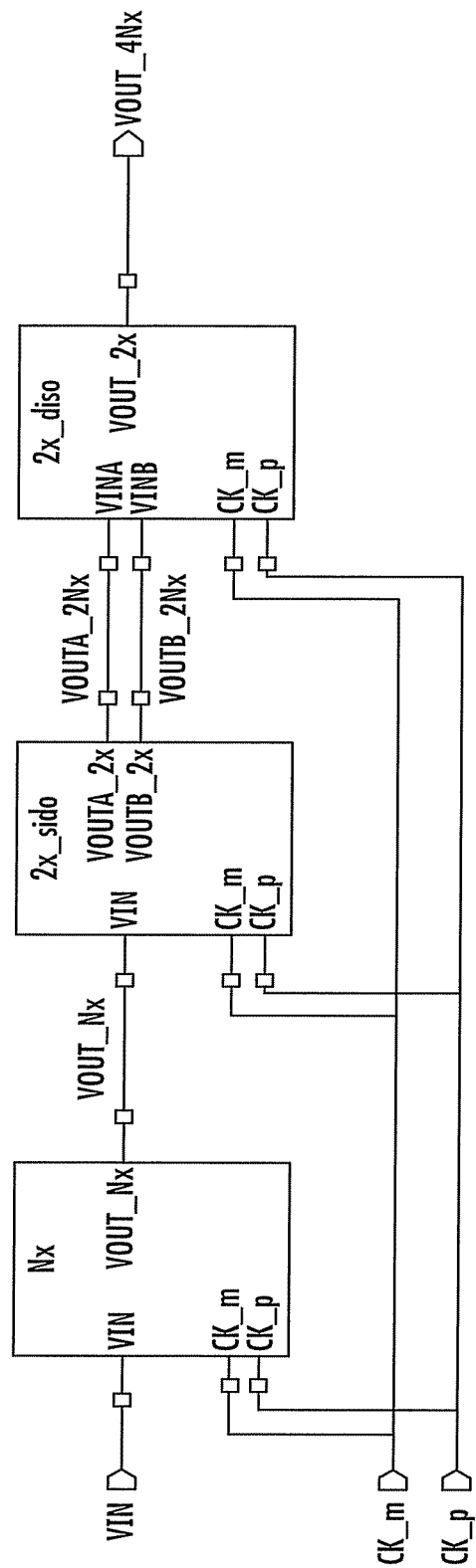
FIG. 3 is a block diagram of another embodiment of the HMF voltage booster in form of an integrated multistage charge pump circuit, according to the present invention.

FIG. 3 shows the schematic block diagram of such an embodiment of the HMF Charge-pump where Nx is the block that provides an output N-times higher than the VIN input voltage, 2×_sido is a single-input-differential-output block that doubles its input voltage, and 2×_diso is a differential-input-single-output block that doubles its input voltage. All blocks are synchronized by non-overlapping clock signals, CK_m and CK_p.

An implementation of the HMF Charge-pump allows minimization of the effect of parasitic components and integration of the whole circuitry for a monolithic realization of the whole controller. In fact, because every integrated capacitor has a parasitic capacitance between a bottom plate and the semiconductor substrate (namely, a parasitic capacitance), an amount of charge is lost due the above mentioned parasitic capacitance during charge-pump switching. This parasitic capacitance impacts heavily on the net yield of the foremost stages that may load "in vain" the parasitic capacitances of successive stages, thus reducing the efficiency of these stages and consequently of the whole charge-pump. A design approach may comprise implementing a first linear stage Nx, capable of boosting as much as possible the voltage, in consideration of the electrical parameters of the fabrication process and integration area requirements, followed by and appropriate number of double stages. This allows for minimization of the impact of parasitic capacitances as most of them (the ones pertaining to the capacitors of the foremost stages) are neutralized because they are directly charged from the supply rails. Furthermore, with a choice of the type of integrated capacitors (the ones having the lowest parasitic capacitance), it is possible to minimize the effect of parasitic capacitances in the doubler stages.

Figure 4:
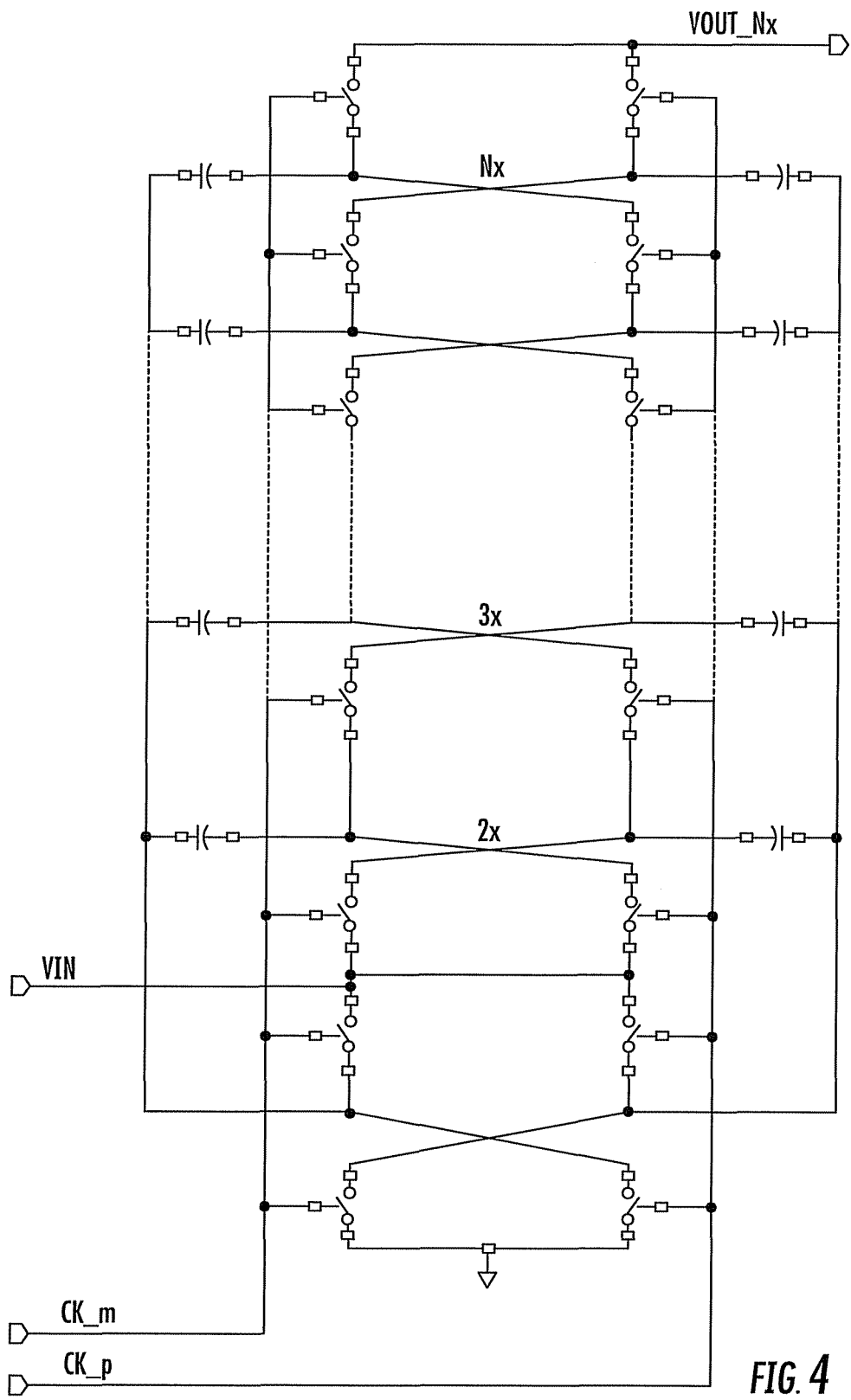
FIG. 4 is a circuit diagram of another embodiment of a first $N_x$ stage of the charge pump of FIG. 3.

FIG. 4 is a basic circuit diagram of an exemplary embodiment of the Nx block. The circuit has a symmetrical two branch structure. During the first clock phase (CK_p is high, CK_m is low), the $i^{th}$ capacitor of the leftmost branch is charged to $i*VIN$ by the $i-1^{th}$ capacitor of the rightmost branch; and during the second clock phase (CK_p is low, CK_m is high), the negative plate of the same leftmost branch $i^{th}$ capacitor is brought to VIN and, at the same time, this capacitor charges the $i+1^{th}$ capacitor of the rightmost branch to $(i+1)*VIN$. A similar mechanism occurs with the capacitors of the rightmost branch. This charging mechanism is the same for all stages except for the first stage where both capacitors are alternately charged to VIN.

Figure 5:
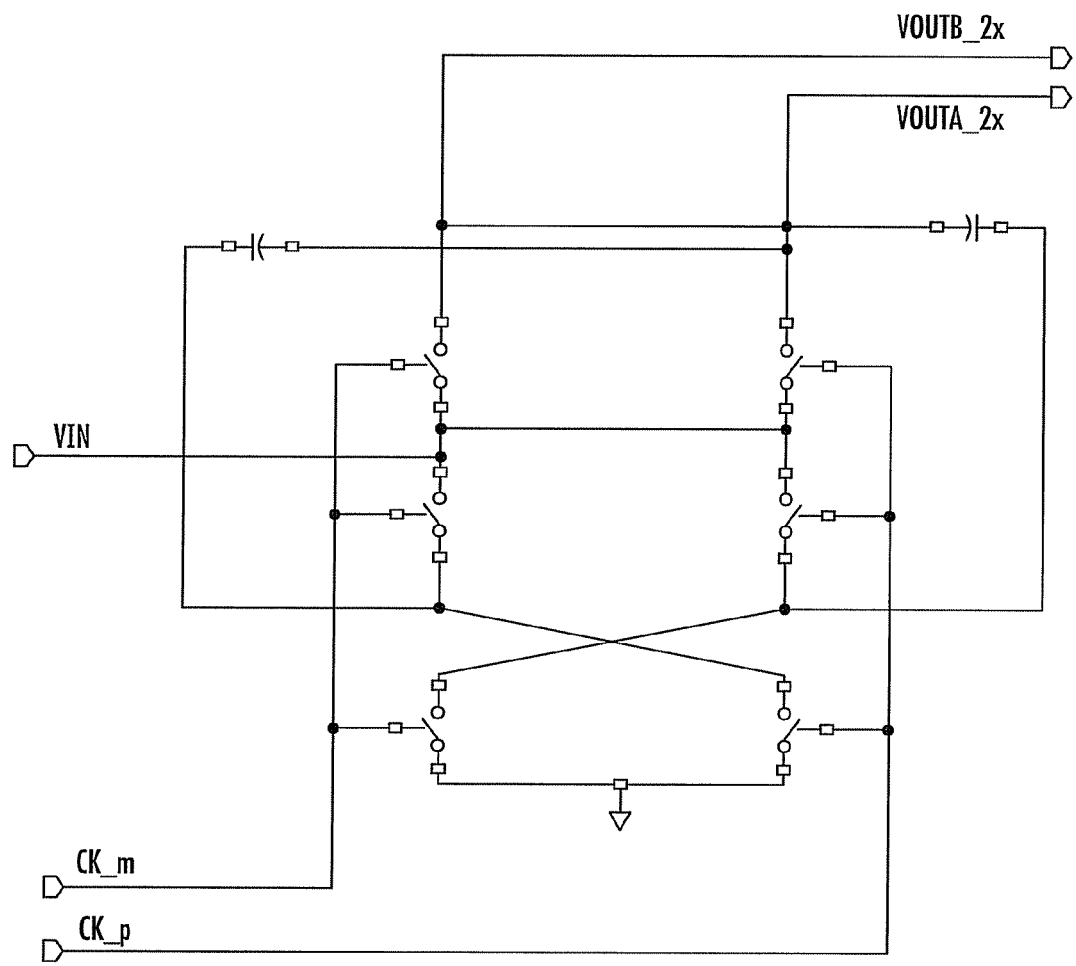
FIG. 5 is a circuit diagram of the 2× single input differential output second stage of the charge pump of FIG. 3.
Figure 6:
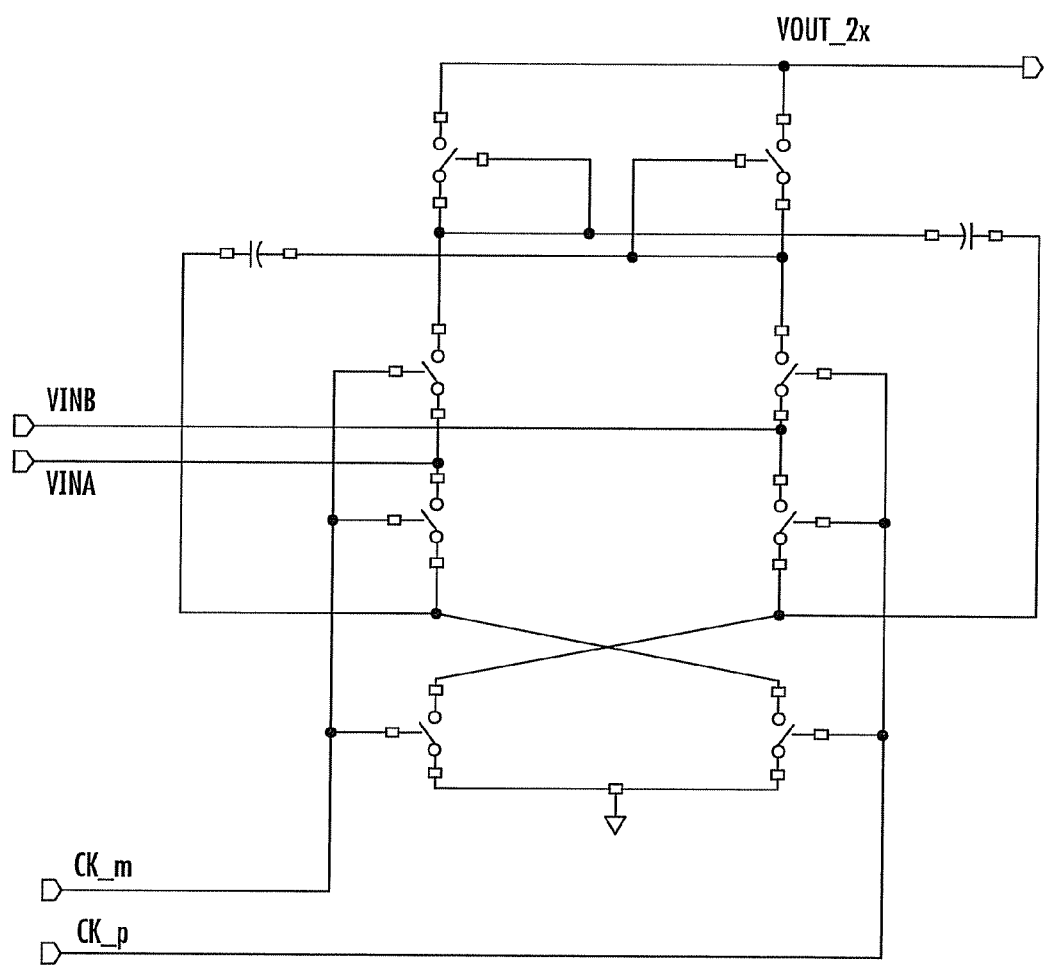
FIG. 6 is a circuit diagram of another embodiment of the 2× differential input single output stage of the charge pump of FIG. 3.

FIGS. 5-6 are basic circuit diagrams of an exemplary of the 2× single-input-differential-output and of the 2× differential-input-single-output blocks, respectively. The charging mechanism is similar to the one described above.

The ability to integrate the main voltage booster may simplify the fabrication of a packaged device, self-supplied and deployable in the junction box of a solar panel in substitution of a traditional by-pass Schottky diode, with greatly improved performance further embedding a protective circuit capable of placing the panel to a null output condition in case of fire. Moreover, provision of a third pin makes the integrated device able to place the solar panel to a null output condition by applying to the third control pin of all the devices installed in the junction box of the panel an overruling DC output suppression command, even from a remote location.

As evident to the skilled person, the system-in-package, devices of this disclosure can be used in substitution of traditional by-pass diodes in solar panels and alike DC power collection/distribution networks as well as safety circuit breakers to prevent damages from accidental polarity inversion of the battery powering a vulnerable circuitry or other electrical load in battery operated systems.

That which is claimed:

1. A protection circuit device for at least one direct current (DC) source coupled to an electrical load, the protection circuit device comprising:
    a controller;
    a power switching metal-oxide-semiconductor field-effect transistor (MOSFET) having conduction terminals to be coupled to the at least one DC source, and a gate terminal to be coupled to an output of said controller;
    a comparator;
    a first voltage booster;
    a second voltage booster configured to boost a MOSFET voltage difference from said conduction terminals of said power switching MOSFET during a by-pass condition in the at least one DC source and to supply said comparator for enabling said first voltage booster;

said first voltage booster configured to be coupled to said gate terminal of said power switching MOSFET for keeping said power switching MOSFET in a conduction mode while the MOSFET voltage difference is sensed by said comparator;

said second voltage booster being configured to turn off when the MOSFET voltage difference reaches a voltage threshold, a supply voltage to said comparator and to said first voltage booster being based upon said first voltage booster;

said controller comprising a control logic circuit having a first input configured to be coupled to an output of said comparator, a second input configured to receive a disable command signal, a first output configured to be coupled to an enable input of said first voltage booster, and a second output, a four terminal path inversion switch configured to receive the MOSFET voltage difference, to invert a sign of the MOSFET voltage difference input to said first voltage booster, and to operate based upon the second output of said control logic circuit, a supply voltage line configured to power said control logic circuit when the MOSFET voltage difference is not inverted, a sensor configured to be coupled to the second input of said control logic circuit, to generate the disable command signal, and to force said power switching MOSFET into the conduction mode, and an external command terminal configured to be coupled to the second input of said control logic circuit, to receive the disable command signal, and to force said power switching MOSFET into the conduction mode.

2. The protection circuit device of claim 1 wherein said comparator comprises a reverse polarity comparator.

3. The protection circuit device of claim 1 wherein the voltage threshold comprises a MOSFET drain/source resistance voltage drop.

4. The protection circuit device of claim 1 wherein the MOSFET voltage difference comprises a MOSFET drain/source voltage difference.

5. The protection circuit device of claim 1 wherein said first voltage booster comprises a high multiplication factor main voltage booster.

6. The protection circuit device of claim 1 wherein said second voltage booster comprises a start-up low multiplication factor voltage booster.

7. The protection circuit device of claim 1 wherein said sensor comprises an integrated risk condition sensor.

8. The protection circuit device of claim 1 wherein the disable command signal is based upon at least one of an external sensor and an external control agent.

9. The protection circuit device of claim 1 wherein said sensor and said external command terminal are configured to force said power switching MOSFET into the conduction mode during non-inversion of the MOSFET voltage difference on the conduction terminals of said power switching MOSFET.

10. The protection circuit device of claim 1 wherein said sensor comprises an integrated temperature sensor configured to generate the disable command signal when a threshold temperature is exceeded.

11. The protection circuit device of claim 1 wherein said first voltage booster comprises an inductive voltage booster with a discrete in-package inductor.

12. The protection circuit device of claim 1 wherein said first voltage booster comprises a multi-stage integrated charge pump.

13. The protection circuit device of claim 12 wherein said multi-stage integrated charge pump comprises:

a first circuit configured to produce an output voltage N times greater than a voltage input to said first voltage booster;

a second single-input-differential-output circuit configured to produce an output voltage two times greater than a respective input voltage; and a third differential-input-single-output circuit configured to produce an output voltage two times higher than a respective input voltage.

14. The protection circuit device of claim 13 wherein said first, second, and third circuits are coupled in cascade and are synchronized by a pair of non-overlapping clock phase signals.

15. A control circuit for a protection circuit device comprising first and second voltage boosters, a comparator coupled thereto, and a metal-oxide-semiconductor field-effect transistor (MOSFET) for bypassing at least one direct current (DC) source, the control circuit comprising:

a control logic circuit having a first input configured to be coupled to an output of the comparator, a second input configured to receive a disable command signal, a first output to be coupled to an enable input of said first voltage booster, and a second output;

a four terminal path inversion switch configured to receive a MOSFET voltage difference, to invert a sign of the MOSFET voltage difference input to the first voltage booster, and to operate based upon the second output of said control logic circuit;

a supply voltage line configured to power said control logic circuit when the MOSFET voltage difference is not inverted;

a sensor configured to be coupled to the second input of said control logic circuit, to generate the disable command signal, and to force the MOSFET into a conduction mode; and an external command terminal configured to be coupled to the second input of said control logic circuit, to receive the disable command signal, and to force the MOSFET into the conduction mode.

16. The control circuit of claim 15 wherein the voltage threshold comprises a MOSFET drain/source resistance voltage drop.

17. The control circuit of claim 15 wherein the MOSFET voltage difference comprises a MOSFET drain/source voltage difference.

18. The control circuit of claim 15 wherein said sensor comprises an integrated risk condition sensor.

19. The control circuit of claim 15 wherein the disable command signal is based upon at least one of an external sensor and an external control agent.

20. The control circuit of claim 15 wherein said sensor and said external command terminal are configured to force the MOSFET into the conduction mode during non-inversion of the MOSFET voltage difference on the conduction terminals of said MOSFET.

21. A method for making a control circuit for a protection circuit device comprising first and second voltage boosters, a comparator coupled thereto, and a metal-oxide-semiconductor field-effect transistor (MOSFET) for bypassing at least one direct current (DC) source, the method comprising:

providing a control logic circuit having a first input to be coupled to an output of the comparator, a second input receiving a disable command signal, a first output to be coupled to an enable input of the first voltage booster, and a second output;

coupling a four terminal path inversion switch to receive a MOSFET voltage difference, to invert a sign of the MOSFET voltage difference input to the first voltage booster, and to operate based upon the second output of the control logic circuit;

coupling a supply voltage line to power the control logic circuit when the MOSFET voltage difference is not inverted;

coupling a sensor to the second input of the control logic circuit for generating the disable command signal and forcing the MOSFET into a conduction mode; and providing an external command terminal to be coupled to the second input of the control logic circuit, to receive the disable command signal, and to force the MOSFET into the conduction mode.

22. The method of claim 21 wherein the voltage threshold comprises a MOSFET drain/source resistance voltage drop.

23. The method of claim 21 wherein the MOSFET voltage difference comprises a MOSFET drain/source voltage difference.

24. The method of claim 21 wherein the sensor comprises an integrated risk condition sensor.

* * * * *